United States Patent [19]

Hata et al.

[11] 4,110,655
[45] Aug. 29, 1978

[54] PIEZO ELECTRIC VIBRATOR UNIT SEALED WITH 90SN-10AU SOLDER

[75] Inventors: Morinaka Hata; Isao Shinoda, both of Tokyo, Japan

[73] Assignee: Kabushiki Kaisha Daini Seikosha, Japan

[21] Appl. No.: 753,847

[22] Filed: Dec. 23, 1976

[30] Foreign Application Priority Data

Dec. 26, 1975 [JP] Japan .................................. 50-157588

[51] Int. Cl.² ........................................... H01L 41/10
[52] U.S. Cl. .................................................. 310/344
[58] Field of Search ........................ 310/344, 342, 370

[56] References Cited

U.S. PATENT DOCUMENTS

| | | | |
|---|---|---|---|
| 2,503,429 | 4/1950 | Ziegler | 310/344 |
| 2,538,495 | 1/1951 | Barry | 310/344 X |
| 3,073,975 | 1/1963 | Bigler et al. | 310/344 |
| 3,940,638 | 2/1976 | Terayama | 310/370 X |
| 3,969,640 | 7/1976 | Staudte | 310/344 |

Primary Examiner—Mark O. Budd
Attorney, Agent, or Firm—Robert E. Burns; Emmanuel J. Lobato; Bruce L. Adams

[57] ABSTRACT

A vibrator unit for use in a timepiece comprises a vibrator mounted within a ceramic case. A glass lid is airtightly sealed to the ceramic case by means of a soldering washer soldered between opposing surface portions of the lid and case. The soldering washer consists essentially of 90Sn-10Au solder alloy which enables formation of the airtight seal at lower and/or shorter soldering temperatures than would be the case with conventional solder alloys thereby avoiding an increase in the equivalent impedance of the vibrator unit which would otherwise occur. As the equivalent impedance can be maintained at a low value, the vibrator unit can therefore be made smaller without adversely affecting the equivalent impedance which is maintained below 350 KΩ.

7 Claims, 2 Drawing Figures

PIEZO ELECTRIC VIBRATOR UNIT SEALED WITH 90SN-10AU SOLDER

DETAILED DESCRIPTION OF THE INVENTION

The present invention relates generally to a vibrator unit and more particularly to an extra thin vibrator unit for a timepiece.

It is recognized that a vibrator unit can be thinly made if the vibrator member and a case to store the vibrator member are formed from thin material. However, as for the conventional vibrator unit employing a metal case known as To5 type or tube type, it is difficult to manufacture a thin vibrator unit is hard to because the vibrator member is cut by means of a mechanical process and structuraly, moreover, the case is limited a as to its thinness so it is very difficult to make a thin vibrator unit. In view of the above mentioned difficulties, a new type extra thin vibrator unit has been developed through the etching technique with the vibrator member being stored in a ceramic case.

The new type extra thin vibrator unit is composed of a quartz crystal vibrator, a case made of ceramic in which is housed the vibrator and a lid made of glass and, for solder sealing, Au is metalized on opposed marginal surface portions of the ceramic case and the glass lid by means of electrolytic metalizing or vacuum evaporation.

In order to achieve an airtight seal a, suitably shaped soldering washer is interposed between the ceramic case and the glass lid and the soldering washer is melted by high frequency induction heating or infrared ray heating under vacuum. In this case, an alloy of 60%Sn-40%Pb is usually used as the material of the soldering washer.

The vibrator unit made in this manner is thin in comparison with the vibrator unit using the conventional metal case, and has enabled formation of thinner quartz crystal timepieces.

In case the vibrator unit is airtightly sealed using the soldering washer, however, the equivalent impedance of the vibrator unfortunately increases under the influence of heating at the time of soldering.

Though the rate of increase or rise of the equivalent impedance differs according to the sealing condition and the internal capacity of the case, the rate particularly depends on the internal capacity. Namely, the smaller the internal capacity becomes, the larger the rate of rise of the equivalent impedance becomes and this drawback has limited the extent of thinness of the conventional case.

The present invention aims to overcome the above mentioned difficulties and insufficiencies and enables formation of a thin quartz crystal unit by employing an alloy of 90%Sn-10%Au as the soldering washer material to effectively reduce the rise in the equivalent impedance caused during the airtight sealing operation.

One of the present invention will be illustrated in accordance with the drawings:

Figure 1:
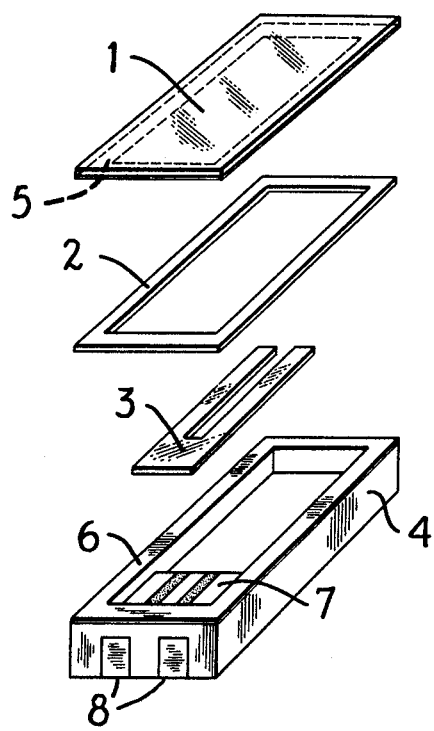
FIG. 1 is an exploded perspective view showing each of the parts composing the vibrator unit of the present invention and, FIG. 2 is a graph showing the relation between the thickness of the vibrator unit and the equivalent impedance of the vibrator.

First, each of the parts composing the vibrator unit of this invention will be described. The vibrator unit comprises a quartz crystal thin plate vibrator 3 of tonometer type made through the photo etching technique, 4 is a stem ceramic case which stores the vibrator, 1 is a flat lid made of glass, and 2 is a soldering washer for airtightly sealing together the ceramic case 4 and the glass lid 1.

A brief description will be given as to the manufacturing method and relative dimension of the parts.

As abovbe mentioned, the thin plate vibrator 3 is made through the photo-etching technique and the vibrator has a thickness less than 100μ, hole length of 3.5 mm and lateral width of 0.5 mm, and is remarkably small and efficient in comparison with the conventional vibrator.

The ceramic case 4 is made by the same method as the method to make the vessel to store IC. That is to say, the necessary electrode pattern is printed on the half-baked ceramic plate using a metal paste, and on the ceramic plate is mounted a ceramic frame, and then the assembly is heated and pressed, then afterwards the paste, plate and frame are baked by heat to around 1500° C. and thereby completely sealed. It can be appreciated that thickness of the vibrator unit is determined by the thickness of the case. Accordingly, it is important to make the vibrator unit as thin as possible on design, however, as mentioned above, if the vibrator unit is made too thin, the equivalent impedance of the vibrator caused by airthight sealing increases remarkably to a point at which the vibrator unit will be impracticable.

In this invention, the inner volume or capacity of the case is enlarged by elongating the longitudinal and lateral dimensions of the case interior. And, because the case should be as small sized as possible while being able to house therein the vibrator member, the dimension of the width-length interior is 2 mm X 5.5 mm. The depth dimensions determines the internal capacity selected from is 5 dimensions, i.e. 0.2 mm, 0.6 mm, 1.0 mm, 1.4 mm and 1.8 mm.

In the present production technique, the width of the case side walls (sealing face) which are formed from a sealing frame should be a minimum 0.5 mm and the bottom plate should be at minimum 0.15 mm in order to maintain the airtightness.

According to the present invention, the external width-length dimension of the case is regularly 3.0 mm × 6.5 mm and the thickness is one of the following 5 kinds, i.e. 0.35 mm, 0.75 mm, 1.15 mm, 1.55 mm and 1.95 mm.

The glass lid 1 is produced by the following procedure; firstly Cr thin film is attached to a flat glass plate of 0.15 mm' thickness, the heat expansion coefficient of which is similar to that of ceramic, and in a shape to correspond to the sealing face of the case by means of evaporation or spattering method, and then Au of suitable thickness is attached.

The soldering washer 2 is formed in a suitable shape which corresponds to the case 4 and the glass lid. In this invention, the soldering washer 2 consists essentially of the solder alloy of 90%Sn-10%Au, while the conventional type washer, by comparison, consists of the alloy of 60%Sn-40%Pb, the thickness of both are 0.05 mm'.

The thickness of the vibrator unit of this invention employing the parts as above is the combined thickness of the glass lid + the soldering washer + the case.

Each of the parts composing the vibrator unit of the present invention is illustrated so far and the manufacturing method of the units of the present invention will be described briefly.

First, the vibrator 3 such as a quartz cyrstal or the like is fixed to a portion 7 of the case 4 by adhesives and a suitable electrode is connected. After that each of the parts composing the unit is heated to about 150° C. in vacuum so as to let the gas out of each of the parts.

Then the soldering washer 2 is interposed between the lid 1 and the case 4 (to both of the sealing face of the case and glass are applied Au) and then the soldering washer is melted by infrared ray or high frequency induction heating while being suitably loaded and while maintaining the necessary degree of vacuum in a vacuum tank until the airtight sealing is completed.

Figure 2:
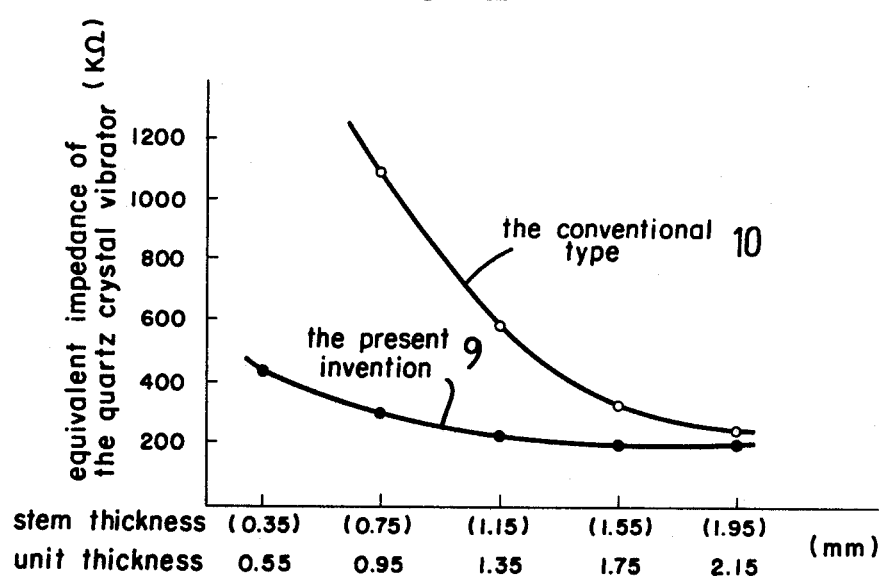

FIG. 2 is a graph showng the relation between the equivalent impedance and the vibration unit thickness for a vibrator unit made by the above mentioned method. In the graph, curve 9 shows the present invention which employs the alloy of 90%Sn–10%Au as the soldering washer material, while curve 10 shows the conventional type (employing the alloy of 60%Sn–40%Pb as the soldering washer material).

The figure clearly shows that the rate of rise of the equivalent impedance with respect to thinning of the unit thickness of the present invention is considerably smaller than for the conventional type. Thus the equivalent impedance of the present invention and the conventional type can be readily compared in accordance with the graph. Assuming from the graph, the equivalent impedance of the conventional type is 350 K$\Omega$ when the unit thickness is 1.7 mm and, in view of the practicability, it is impossible to make the unit thickness less than 1.7 mm as the equivalent impedance would be too high.

However, according to the present invention, the equivalent impedance is about 200 K$\Omega$ when the unit thickness is 1.7 mm and hence the impedance is remarkably lower than the conventional type. So that if the equivalent impedance of the practicable vibrator is fixed at about 350 K$\Omega$ similarly to the conventional type, the unit thickness can be made as small as 0.6 mm.

The difference of the equivalent impedance of the present invention and that of the conventional type comes from the difference of the soldering washer material. Namely, the out gas generation from the soldering washer at the time of heating in the present invention is smaller than the in conventional type; furthermore, as diffusion of the case and Au of the glass lid is very rapid, the heating step is more rapid and unnecessary heating can be avoided. As for the conventional type, the heating time for full diffusion of the soldering washer after melting thereof should be kept long in order to keep the reliability.

As illustrated so far, according to the present invention, the increase in the equivalent impedance caused by making the case thinner is much smaller than the conventional type and therefore the efficiency is greater.

The reason why the thickness of the vibrator unit should preferably be limited between 0.6 mm–1.6 mm will now be illustrated.

The maximum thickness 1.6 mm is determined since it is distinctly less than the thinnest thickness practicable in the conventional technique, i.e., 1.7 mm, and if the thickness is more than 1.6 mm, the present invention becomes ineffective as the thickness approaches that of the prior art. While the minimum thickness 0.6 mm is determined since if the thickness is thinner than that this, the equivalent impedance of the vibrator exceeds 350 K$\Omega$ and the is practically no good, furthermore the workability is exceedingly hindered when the vibrator is stored in the case.

As particularly illustrated, according to the present invention which employs the alloy of 90%Sn–10%Au as the soldering washer, a rise in the equivalent impedance caused by airtight sealing is reduced and the vibrator unit is remarkably thinned, and consequently the quartz crystal timepiece can be made very thin. Though in the present embodiment, the quartz vibrator is stored in the case as an example, a similar effect can be expected even when a piezo-electric vibrator rather than the quartz crystal is used.

While, though the lid made of glass is used for a lid to seal the case, the similar effect is expected even if the airtight lid made of ceramic or metal is used.

We claim:

1. A vibrator unit for use in a timepiece and the like comprising: a ceramic case having closed bottom and sidewall portions and an open top portion; a vibrator mounted to undergo vibration within said ceramic case; a lid disposed over the open top portion of said ceramic case; and means airtightly sealing together said lid and ceramic case, said means consisting of a soldering washer soldered between opposing surface portions of said lid and ceramic case and consisting essentially of 90Sn–10Au solder alloy.

2. A vibrator unit according to claim 1; wherein the vibrator unit has a thickness, as measured from the top surface of said lid to the bottom surface of said ceramic case bottom portion, no greater than 1.6 mm.

3. A vibrator unit according to claim 2; wherein the vibrator unit has an equivalent impedance no greater than 350 K$\Omega$.

4. A vibrator unit according to claim 1; wherein the vibrator unit has a thickness, as measured from the top surface of said lid to the bottom surface of said ceramic case bottom portion, within the range 0.6 to 1.6 mm.

5. A vibrator unit according to claim 4; wherein the vibrator unit has an equivalent impedance no greater than 350 K$\Omega$.

6. A vibrator unit according to claim 1; wherein said ceramic case has a rectangular parallelepiped configuration with an external length dimension no greater than 6.5 mm, an external width dimension no greater than 3.0 mm and an external thickness dimension no greater than 1.55 mm.

7. A vibrator unit according to claim 6; wherein the vibrator unit has an equivalent impedance no greater than 350 K$\Omega$.